United States Patent
Geris et al.

(10) Patent No.: US 8,793,086 B2
(45) Date of Patent: Jul. 29, 2014

(54) METHOD AND SYSTEM FOR DETECTING POWER SUPPLY SOURCE ELECTRICAL CURRENT CAPACITY

(75) Inventors: Ryan Alexander Geris, Kitchener (CA); Jameson Bauer Hyde, Cambridge (CA)

(73) Assignee: BlackBerry Limited, Waterloo Ontario (CA)

( * ) Notice: Subject to any disclaimer, the term of this patent is extended or adjusted under 35 U.S.C. 154(b) by 240 days.

(21) Appl. No.: 13/032,919

(22) Filed: Feb. 23, 2011

(65) Prior Publication Data
US 2012/0215468 A1 Aug. 23, 2012

(51) Int. Cl.
G06F 19/00 (2011.01)
G01R 19/00 (2006.01)

(52) U.S. Cl.
USPC .......................................... 702/61; 324/76.11

(58) Field of Classification Search
CPC ................................. G06F 19/00; G01R 19/00
USPC ............... 320/106–121, 156–162; 324/76.11, 324/600; 702/61, 63–65
See application file for complete search history.

(56) References Cited

U.S. PATENT DOCUMENTS

| | | | | |
|---|---|---|---|---|
| 5,191,277 A * | 3/1993 | Ishikura et al. | ................ | 320/114 |
| 5,561,361 A * | 10/1996 | Sengupta et al. | ............. | 320/152 |
| 5,739,667 A * | 4/1998 | Matsuda et al. | ............. | 320/128 |
| 5,771,471 A * | 6/1998 | Alberth et al. | ................ | 455/573 |
| 5,777,399 A * | 7/1998 | Shibuya | .......................... | 307/66 |
| 6,100,670 A | 8/2000 | Levesque | | |
| 7,656,132 B2 | 2/2010 | So et al. | | |
| 7,843,171 B2 * | 11/2010 | Schroeder et al. | ............ | 320/138 |
| 7,990,106 B2 * | 8/2011 | Hussain et al. | ................ | 320/128 |
| 2007/0188144 A1 | 8/2007 | Hara et al. | | |
| 2008/0169705 A1 | 7/2008 | Tan et al. | | |
| 2008/0238203 A1 | 10/2008 | Kotikalapoodi et al. | | |
| 2008/0258688 A1 | 10/2008 | Hussain et al. | | |
| 2009/0027013 A1 | 1/2009 | Odaohhara | | |

(Continued)

FOREIGN PATENT DOCUMENTS

EP 2202864 A2 6/2010

OTHER PUBLICATIONS

"Application Note 3607: Charging Batteries from USB". Internet Citation, Aug. 25, 2005, XP003014134; retrieved from the Internet: URL:http://www.maxim-ic.com/appnotes.cfm/appnote_number/3607_1.

(Continued)

Primary Examiner — John Breene
Assistant Examiner — Ruihua Zhang
(74) Attorney, Agent, or Firm — Jeffrey N. Giunta; Fleit Gibbons Gutman Bongini & Bianco PL

(57) ABSTRACT

An apparatus and method for determining a power supply electrical current capacity. In one example, an operating circuit is placed into an operating mode that causes the operating circuit to have a determined electrical current consumption. A charging circuit that is electrically connected in parallel with the operating circuit is configured to provide a maximum charging current to a power pack. After configuring the charging circuit, a value of a measured charging current provided to the power pack is received. After receiving the value of the measured charging current, an electrical current supply capacity value of the external power supply is determined as a function of the determined electrical current consumption and the value of the measured charging current.

22 Claims, 5 Drawing Sheets

(56) References Cited

U.S. PATENT DOCUMENTS

| | | | |
|---|---|---|---|
| 2009/0085528 A1* | 4/2009 | Yamada | 320/160 |
| 2009/0102431 A1* | 4/2009 | Kung et al. | 320/162 |
| 2009/0108810 A1 | 4/2009 | Sawyers | |
| 2009/0115369 A1* | 5/2009 | Lin et al. | 320/114 |
| 2009/0121684 A1 | 5/2009 | Hussain et al. | |
| 2009/0184687 A1 | 7/2009 | Schroeder et al. | |
| 2009/0189569 A1* | 7/2009 | Hsu et al. | 320/160 |
| 2009/0195230 A1 | 8/2009 | Adkins et al. | |
| 2009/0267571 A1 | 10/2009 | Wolf et al. | |
| 2009/0295338 A1 | 12/2009 | Hawawini et al. | |
| 2009/0295339 A1 | 12/2009 | Wong | |
| 2010/0079114 A1 | 4/2010 | So et al. | |
| 2010/0270981 A1* | 10/2010 | Motomiya | 320/160 |
| 2011/0298426 A1* | 12/2011 | Hussain et al. | 320/128 |

OTHER PUBLICATIONS

Extended European Search Report dated Sep. 9, 2011 for European Patent Application No. 11155704.

SUMMIT Microelectronics, Programmable Switch-Mode, Li+ Battery Chargers With TurboCharge™ Mode, USB "On the Go" Power, USB Power Source Detection and Automatic Input Current Limiting, SMB329/SB339, Copyright SUMMIT Microelectronics, Inc., 2004, Sunnyvale, California, http://www.summitmicro.com/ 2132 2.6 May 5, 2009.

Canadian Office Action dated Nov. 18, 2013 for Canadian application No. 2,769,143.

* cited by examiner

METHOD AND SYSTEM FOR DETECTING POWER SUPPLY SOURCE ELECTRICAL CURRENT CAPACITY

FIELD OF THE DISCLOSURE

The present disclosure generally relates to electronic device power supplies and more particularly to detecting power supply capacities.

BACKGROUND

Electronic devices, such as portable electronic devices, are often able to be powered by an external power supply that supplies power to operate electronic circuits and also to recharge internal batteries. Some portable electronic devices receive power through external data communications interfaces, such as Universal Serial Bus (USB) interfaces. The USB standard defines a required electrical current capacity that a USB interface must be able to supply to connected devices. Devices that receive power pack charging power through a standard USB interface are also able to be connected to power supplies, such as modular wall mounted power supplies with a USB connector, that are capable of delivering electrical current in excess of the capacity specified by the USB specification.

However, electrical current through a USB port is limited to the level specified by the USB standard unless power supply capacity is able to be determined and a no reliable maximum electrical current can be assumed to be provided through non-USB power interfaces.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
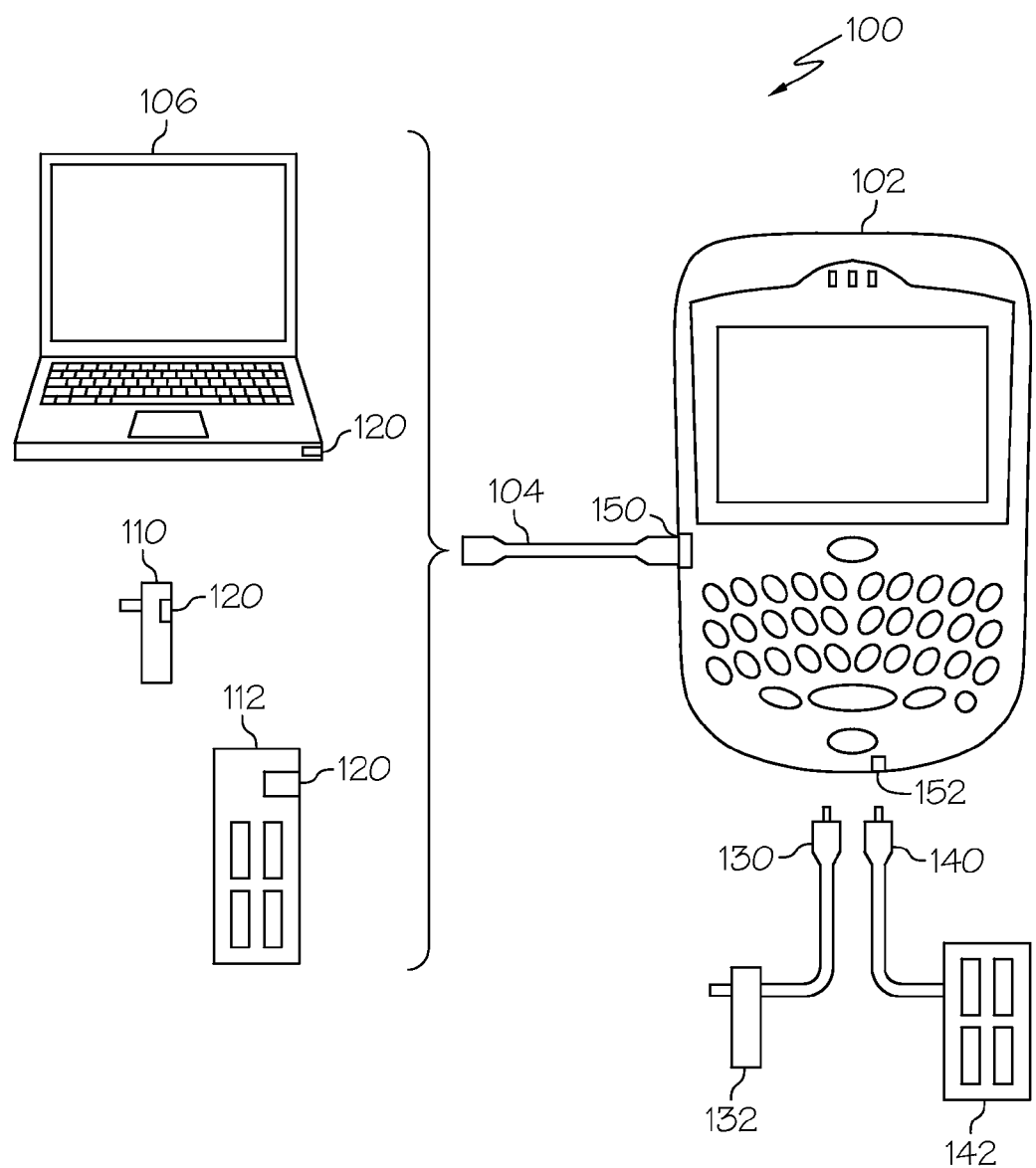
FIG. 1 is a device component interconnection diagram according to an example.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the disclosed subject matter in virtually any appropriately detailed structure and function. Further, the terms and phrases used herein are not intended to be limiting, but rather, to provide an understandable description.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected," although not necessarily directly, and not necessarily mechanically. "Communicatively coupled" refers to coupling of components such that these components are able to communicate with one another through, for example, wired, wireless or other communications media. The term "configured to" describes hardware, software or a combination of hardware and software that is adapted to, set up, arranged, commanded, altered, modified, built, composed, constructed, designed or that has any combination of these characteristics to carry out a given function. The term "adapted to" describes hardware, software or a combination of hardware and software that is capable of, able to accommodate, to make, or that is suitable to carry out a given function.

Described below are systems and method for determining a maximum electrical current supply capacity value of an external power supply connected to an electronic device. Although existing proprietary techniques are used to communicate the charging capacity of USB-connected power supplies, no standard technique exists to communicate the electrical current capacity of a USB-connected power supply. Power supplies that are connected to a device through connections other than through USB connectors do not have a standard electrical current capacity that can be relied upon. The below described systems and methods determine the capacities of power supplies without an explicit communication of that data.

The determination of the electrical current capacity by the below described systems and methods of a power supply results in more efficient power supply utilization and power pack charging. An external power supply with an unknown maximum electrical current supply capacity value is connected to an electronic device. The electronic device, according to one example, places the electronic circuits, or operating circuits, of the electronic device into an operating mode that causes the operating circuits to draw a determined electrical current. In the context of this specification, a determined electrical current for a particular operating mode is a known value of electrical current that is consumed by a component or device when in that particular operating mode. The determined electrical current is known through calculations, measurements, or other techniques to identify the electrical current drawn by an operating circuit in a given operating mode. The determined electrical current is known by performing these techniques prior to the use of the determined electrical current in a calculation or other function. The electronic device then causes a maximum charging current to be provided to charge the device's power pack. The electrical current provided to the device's power pack is then measured. The determined electrical current drawn by the operating circuits is then added to the measured electrical current provided to the device's batteries to determine the maximum supply electrical current available from the external power supply.

The described system and methods allow the maximum electrical current capacity of an unknown external power supply to be determined using a power pack charging current measurement device that may be included in the electronic device for other uses. A power pack charging current measurement device is included in electronic devices to determine the recharge state of a power pack, for example, either during charging or discharging. The described system and methods also allow the characterization of the external power supply without completely shutting down the operating circuits of the electronic device.

FIG. 1 is a device component interconnection diagram 100 according to one example. The interconnection diagram 100 shows a portable electronic device 102, such as a Personal Digital Assistant (PDA), a smart-phone, a cellular telephone, or any other type of portable electronic device. The portable electronic device 102 receives power through one or more interfaces, including one or both of a DC power connection 152 or a USB port 150. Further portable electronic devices are able to use only one of a DC power connection 152 and a USB port 150 as an external power connection, or may include other types of power connections.

DC power connection 152 is an external power connection that is able to be detachably connected to any suitable external DC power supply. Examples of external DC power supplies include a wall mounted power supply 132 that also has a transformer and rectifier, and may include voltage regulation functions. The wall mounted power supply 132 connects to the DC power connection 152 through a cable with suitable plug 130 that is matched to the DC power connection 152. The DC power connection 152 is also able to be connected to an external power pack 142 via a cable with a suitable plug 140 that is also matched to the DC power connection 152.

The USB port 150 of the portable electronic device 102 of one example is used to provide data communications and, in one example, is also an external power connection. In this example, the USB port 150 is detachably connected to an external power supply and supplies electrical DC power to the electronic operating circuits of the device and also supplies power to power pack or battery charging circuits of the device. The USB port 150 is able to be detachably connected through a USB cable 104 to a number of devices that provide power, exchange data, or both. The USB port 150 is able to be connected to, for example, a computer 106 that is equipped with a USB port 120. The computer 106 in this example is an external power supply that is detachably connected to the portable electronic device 102.

In addition to a computer 106 or other data communications device, the USB port 150 of the portable electronic device 102 is able to be detachably connected to a dedicated power supply to provide DC power to operating circuits and to a power pack charging circuit of the portable electronic device 102. Dedicated power supplies that can be connected to the USB port 150 of the portable electronic device 102 include a wall mounted transformer-based power supply 110 with a USB port 120. Power supply 110 may also include a transformer and other power conditioning circuits to provide +5V through its USB port 120. The USB port 150 of the portable electronic device 102 is also able to be connected through the USB cable 104 to an external battery pack 112 that has a USB port 120.

Figure 2:
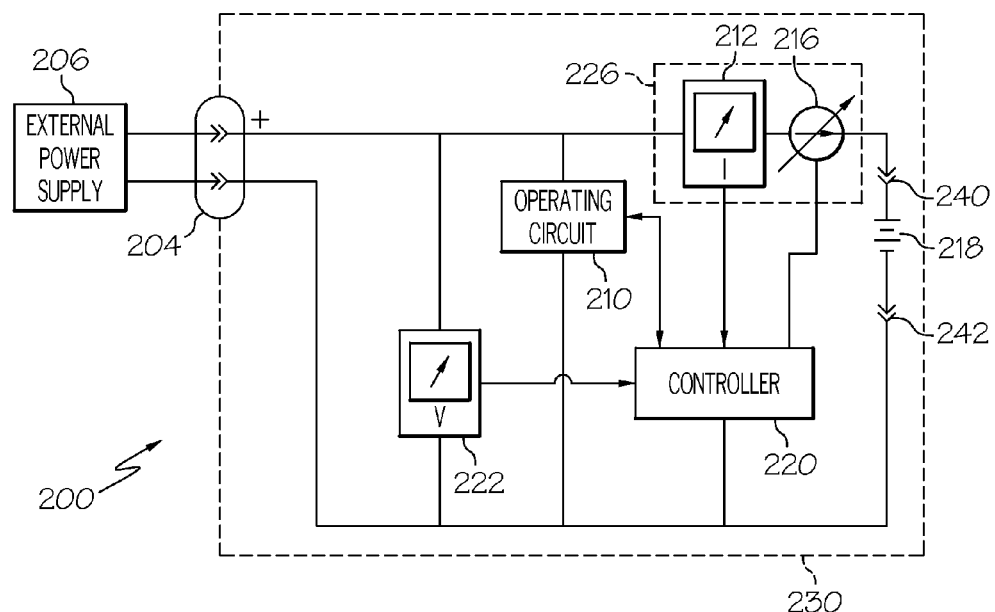
FIG. 2 is a circuit diagram illustrating power supply components of a portable electronic device as illustrated in FIG. 1.

FIG. 2 is a circuit diagram 200 illustrating power supply components of a portable electronic device 102. The circuit diagram 200 illustrates a portion of the circuits present in the portable electronic device 102 discussed above. In the circuit diagram 200, an external power supply 206 is connected to the example electronic device 230 through an external power connection 204. The external power connection 204 is, for example, included in a USB port or in a dedicated power connection port of the example electronic device 230, such as the DC power connection 152 discussed above.

The example electronic device 230 includes operating circuits 210 that performs, for example, processing associated with a cellular telephone, a smart phone, a personal digital assistant (PDA), or some or all of any processing required by the example electronic device 230. In one example, the operating circuits 210 are able to be placed into one or more modes. The operating circuits 210 are able to be configured into an operating mode wherein the operating circuits 210 have a determined electrical current consumption while operating in that operating mode. In various examples, the operating circuits 210 are able to be configured by, for example, setting switches, controlling components or current paths, issuing commands over a communications link, making measurements, and any other technique. An example of such an operating mode into which the operating circuits 210 can be configured into is a standby mode for the operating circuit. The determined electrical current consumption in the standby mode is able to be determined, for example, by measurements taken during device testing either for that particular device or for a prototype of that device. In general, a determined electrical current consumption for any operating mode is able to be determined by such methods. In various examples, these determined electrical current consumption values are known values and are values that may be substantially fixed, though these values may vary based upon certain criteria or other variables. The determined electrical current consumption values are stored and used in further processing, as is described below.

The example electronic device 230 further includes a power pack that in one example consists of a battery 218. Further examples are able to include any suitable power pack such as a fuel cell, a solar cell, and the like. The battery 218 is used as a power source when, for example, the external power supply 206 is not connected to the example electronic device 230. Battery 218 is also able to augment the power provided to the operating circuits 210 when the external power supply 206 is connected to the example electronic device 230 but when the operating circuits 210 are operating in a mode that has an electrical current consumption that is greater than the electrical current supply capacity value of the external power supply 206.

The example electronic device 230 includes a controller 220 that controls the operating circuits 210 and also controls charging of the battery 218. The controller 220 is able to place the operating circuits 210 into one or more modes. The various modes of the operating circuits are modes in which the operating circuits 210 draw a known or determined electrical current value. A first operating mode for which the operating circuits 210 have a determined or known electrical current consumption value includes a "standby" mode where the operating circuits are performing a minimum of processing that does not vary. The determined electrical current consumption value for the standby mode is able to be obtained by any suitable method, such as through measuring a sample circuit operating in that mode, or through a theoretical analysis of the circuit to obtain a value. The determined electrical current consumption value is able to be programmed into controller 220 for use in performing the below described method. A second operating mode for which the operating circuits 210 have a large electrical current consumption is an RF transmission mode where high power RF energy is being generated for transmission to a remote receiver.

The example electronic device 230 includes a battery charging circuit 226 that has a battery electrical current meter 212 and a variable current limiter 216. The battery 218 in one example is electrically connected to the positive voltage of the external power supply 206 through the battery charging circuit 226, and therefore in series with battery charging circuit 226 and therefore in series with the battery electrical current meter 212 and the variable current limiter 216. The battery charging circuit 226, along with battery 218, is also connected in parallel with the operating circuit 210. In the context of this specification, components that are referred to as being connected in parallel are able to be connected either directly in parallel or substantially in parallel. Components that are connected substantially in parallel are able to have terminals that are connected together either through direct coupling or indirect coupling. An indirect coupling is able to include, as an example, a connection that includes resistive components, reactive components, active components, or combinations of two or more of these types of components. Components connected in series are also able to be connected substantially in series, in which one terminal of each component is coupled either directly or indirectly. Examples of indirect connections are described above.

The battery electrical current meter 212 is an electrical current measurement device that measures the amount of electrical current flowing into or out of the battery 218. Although an electrical current meter is illustrated, any electrical current measurement device that is able to measure electrical current flow to the better 218 or other power pack by any technique is suitable for the functionality depicted for the battery electrical current meter 212. The battery electrical current meter 212 in one example provides a value of measured electrical current to the controller 220. When the battery 218 is providing power to operate the example electronic device 230, such as when the external power supply 206 is not connected, the battery electrical current meter 212 is monitored by controller 220 to determine the amount of electrical current drawn from the battery 218 to support, for example, estimating the amount of charge remaining in the battery 218. Battery 218 is electrically connectable to the battery charging circuit 226 through battery contacts 240 and 242. Battery contacts 240 and 242 allow battery 218 to be electrically disconnected and physically removed from the example electronic device 230.

The controller 220 of one embodiment receives a value of a measured charging current provided to the battery 318 and is configured with a determined electrical current consumption of the operating circuits 210 when in the operating mode into which the operating circuits 210 had been configured. The charging current that is measured to create the measured charging current is generally an unknown quantity and is determined by measurement devices in communications with the controller 220. The controller then determines the electrical current supply capacity of the external power supply 206 as a function of the determined electrical current consumption and the value of the measured charging current.

The controller 220 commands the variable current limiter 216 to limit the charging current provided to the battery 218 during battery charging. Once the electrical current supply capacity value of the external power supply 206 is determined, as is described in further detail below, the controller 220 is able to command the variable electrical current limiter 216 to provide a maximum charging current to the battery 218 as a function of the determined capacity of the currently connected external power supply 206.

The example electronic device 230 further includes a voltage measurement device, such as a voltage meter 222, to measure the voltage being supplied by the external power supply 206. Various examples are able to use any type of voltage measurement device to measure the voltage supplied by the external power supply 206. As the output electrical current of an external power supply reaches its upper limit, the output voltage of the external power supply decreases. In one example, the electrical current capacity of the external power supply is determined by increasing the battery charging current until the input voltage of the external power supply is reduced to a specified minimum level required by the operating circuits 210. In this example, operation of the voltage meter 222 includes monitoring a supply voltage provided by the external power supply 206 and provides readings of a measured input voltage to the controller 220. The controller 220 then monitors the measured input supply voltage provided by the external power supply and commands the variable current limiter 216 to vary the charging current to the battery to cause the supply voltage to be a specified minimum supply voltage. The specified minimum supply voltage in one example is a minimum specified supply voltage for the operating circuit 210. Other specified minimum supply voltages are able to be used based upon the nature of operating circuit 210.

Figure 3:
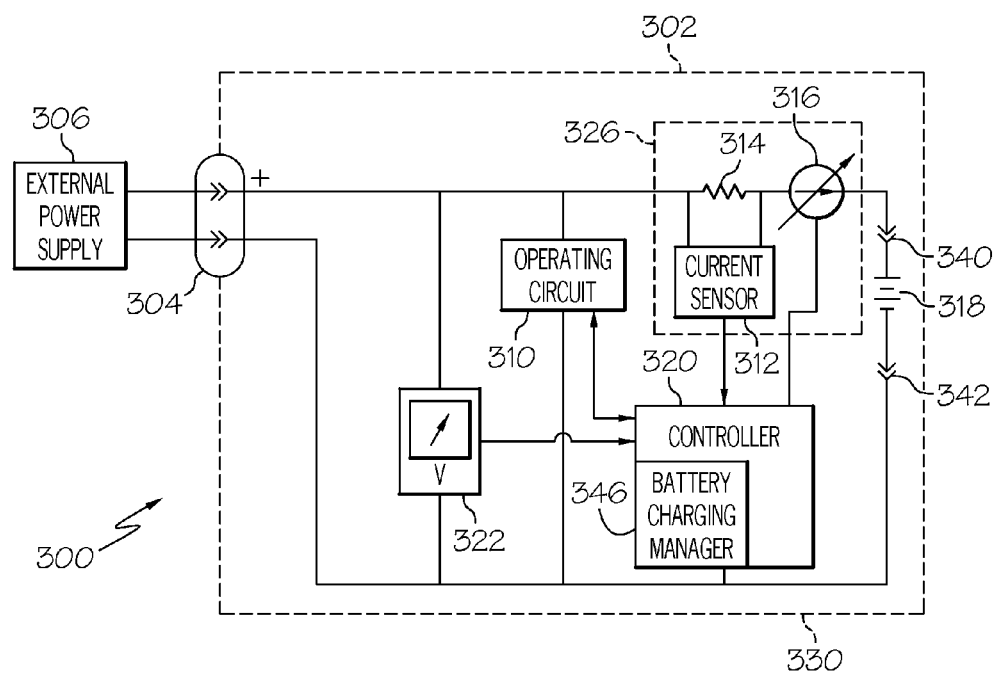
FIG. 3 is a second component interconnection diagram illustrating components of an alternative electronic device as illustrated in FIG. 1.

FIG. 3 is a second component interconnection diagram 300 illustrating components of an alternative electronic device. The second component interconnection diagram 300 includes a second electronic device 330 with a USB port 304 that is connected to an external power supply 306. The USB port 304 provides data communications for the second electronic device 330 and also serves as an external power connection for the second electronic device 330. The external power supply 306, when connected through the external power connection included in the USB port 304, provides power to an operating circuit 310 and also provides power to the second electronic device 330 for charging the battery 318. Battery 318 is also able to provide power to the operating circuit 310 when the external power supply 306 is disconnected from the second electronic device 330. The second electronic device 330 has a voltage meter 322 to measure voltage being supplied by the external power supply 306 to support functionality described below.

A controller 320 provides control of the operating circuit 310. Controller 320 is able to configure the operating circuit 310 into a mode in which the operating circuit 310 draws a known electrical current value.

The second electronic device 330 also contains a battery charging circuit 326 that includes a variable current limiter 316, an electrical current sense resistor 314 and an electrical current meter 312. Battery 318 is able to be electrically connectable to the battery charging circuit 326 by battery contacts 340 and 342.

Controller 320 is able to limit the charging current provided to battery 318 by controlling the variable current limiter 316 to limit charging current delivered to the battery 318. In one example, the controller 320 includes a battery charging manager 346 that receives the determined electrical current supply capacity value of the external power supply 306. The battery charging manager 346 within the controller 320 determines a maximum charging current value that is a function of the electrical current supply capacity value of an external power supply 306. The controller 320 limits the charging current delivered to the battery 318 to the maximum charging current value by controlling the variable current limiter 316.

The variable current limiter 316 of the battery charging circuit 326 is also able to be switchably configured to supply power from the battery 318 to the operating circuits 310. In one example, controller 320, configures the battery charging circuit, by control of the variable current limiter 316, to supply the operating circuits 310 with power from the battery 318 in response to detecting that the operating circuits are in a second operating mode that has an electrical current consumption greater than the supply electrical current capacity of the external power supply 306. An example of an operating mode of the operating circuits that has an electrical current consumption greater than the supply electrical current capacity of the external supply is an operating mode in which the electronics circuits generate a high power Radio Frequency (RF) signal for transmission. Controller 320 is able to monitor or command the operating mode of the operating circuits 310 to determine the operating mode of the operating circuits. The controller 320 is also able to maintain a table of electrical current draws for those various operating modes. The controller 320 is then able to configure the power supply to supply power to the operating circuits from the battery if the detected operating mode of the operating circuits has an electrical current draw greater than the electrical current supply capacity value of the external power supply.

Electrical current being provided to the battery is measured by a combination of an electrical current sense resistor 314 and an electrical current meter 312. Electrical current flowing to battery 318 causes a voltage drop across the electrical current sense resistor 314. Electrical current meter 312 measures the voltage across the electrical current sense resistor 314 and, as a function of that measured voltage and the known resistance of the electrical current sense resistor 314, determines a measured electrical current value flowing into, or out of, battery 318. This value of the measured electrical current is provided to controller 320, and controller 320 in turns receives the value of the measured electrical current. In the case of battery charging, the value of the measured electrical current is the value of measured charging current.

Figure 4:
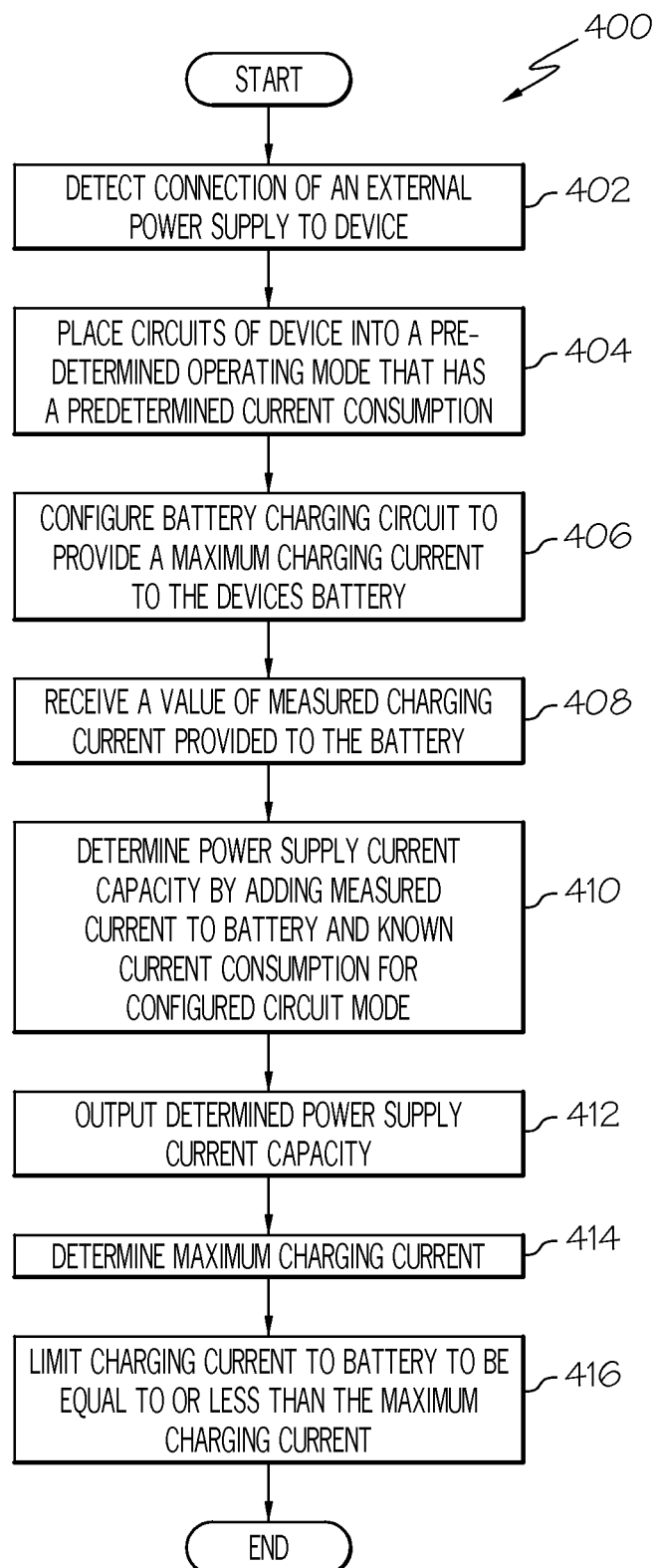
FIG. 4 is a flow diagram for a power supply electrical current capacity determination process as performed by the electronic device illustrated in FIGS. 2 and 3.

FIG. 4 is a flow diagram for a power supply electrical current capacity determination process 400. The power supply electrical current capacity determination process 400 determines the maximum electrical current supply capacity value of an external power supply, such as external power supply 206 described above. The power supply electrical current capacity determination process 400 determines the maximum amount of electrical current that is able to be provided by an external power supply connected to an electronic device. In the example second electronic device 230 described above with regards to FIG. 2, the power supply electrical current capacity determination process is performed by controller 220 to determine the maximum electrical current supply capacity value of the external power supply 206.

Once the maximum electrical current capacity of the external power supply 206 is determined, the controller 220 is able to command, through the variable current limiter 216, a maximum amount of charging current to be provided to charge the battery 218. The maximum amount of charging current to be provided to charge the battery 218 is able to be set as a function of an electrical current consumption of the operating circuit and the electrical current supply capacity value of the external power supply. In some examples, the controller 220 is able to reduce the maximum amount of charging current provided to charge the battery 218 by an expected amount of electrical current being drawn by the operating circuits 210 based upon a mode in which the operating circuits 210 are operating.

Various techniques are able to be used to determine the amount of charge remaining in the battery. A time remaining until the battery is charged is able to be determined as a function of the remaining charge in the battery and one or both of the maximum electrical current capacity of the external power supply 206 and the maximum amount of charging current to be provided to charge the battery 218.

The power supply electrical current capacity determination process 400 begins by detecting, at 402, a connection of an external power supply to a device. In one example, an external power supply is connected to a portable electronic device through a USB connection. In the example of FIG. 2, detection of an external power supply to the device is able to be performed by monitoring the voltage meter 222 or the battery electrical current meter 212 to detect changes consistent with a connection of an external power supply to an external power supply connection of the device.

The power supply electrical current capacity determination process 400 continues by placing, at 404, the operating circuits of the electronic device into an operating mode that has a determined electrical current consumption while they are operating in that operating mode. In the example of FIG. 2, the controller 220 places the operating circuits 210 into a mode where the operating circuits 210 consume a known electrical current. One example of such a mode is a standby mode, where the operating circuits are performing a minimum of processing and are consuming a constant and known amount of electrical current.

The power supply electrical current capacity determination process 400 configures, at 406, the battery charging circuit to provide a maximum charging current to the device's battery. In one example of the operation of the circuits of FIG. 2, the controller 220 commands the variable current limiter 216 to vary the charging current provided to the battery 218 to cause the supply voltage, as measured by voltage meter 222, to be reduced to a specified minimum supply voltage level. In this example, the voltage meter 222 monitors the supply voltage provided by the external power supply. The specified minimum supply voltage level is a function of, for example, a specified minimum operating voltage for operating circuits 210.

The power supply electrical current capacity determination process 400 receives, at 408, a value of a measured charging current provided to the battery. This electrical current is measured by use of the battery electrical current meter 212 in the example of FIG. 2, or by the combination of electrical current sense resistor 314 and electrical current meter 312 in the example of FIG. 3, and the value of the measured charging current is received by controller 220.

The power supply electrical current capacity determination process 400 determines, at 410, the external power supply electrical current capacity as a function of the determined electrical current consumption and the value of the measured charging current. One example determines the external power supply electrical current capacity by adding the value of the measured charging current provided to the battery and the known, determined electrical current consumption for the configured mode of the operating circuit. The determined power supply capacity is then outputted, at 412, as an output of the power supply electrical current capacity determination process 400. This determined power supply capacity is stored as a parameter to be used to determine the maximum amount of electrical current that can be used to charge the device's battery.

The power supply electrical current capacity determination process 400 determines, at 414, a maximum charging current value. The maximum charging current value is the highest electrical current that can be supplied to the battery given the external power supply electrical current capacity. The maximum charging current value is able to be reduced as a function of expected electrical current consumption of other parts of the device, such as operating circuits 210 discussed above with regards to FIG. 2.

The power supply electrical current capacity determination process 400 limits, at 416, the charging current delivered to the battery to the maximum charging current value. By limiting the charging current to the maximum charging current, the charging current is able to be less than the maximum charging current value but does not exceed the maximum charging current value. The charging current may be less than the maximum charging current value due to, for example, battery charging current profiles for the battery used by the device. This ends the power supply electrical current capacity determination process 400.

Figure 5:
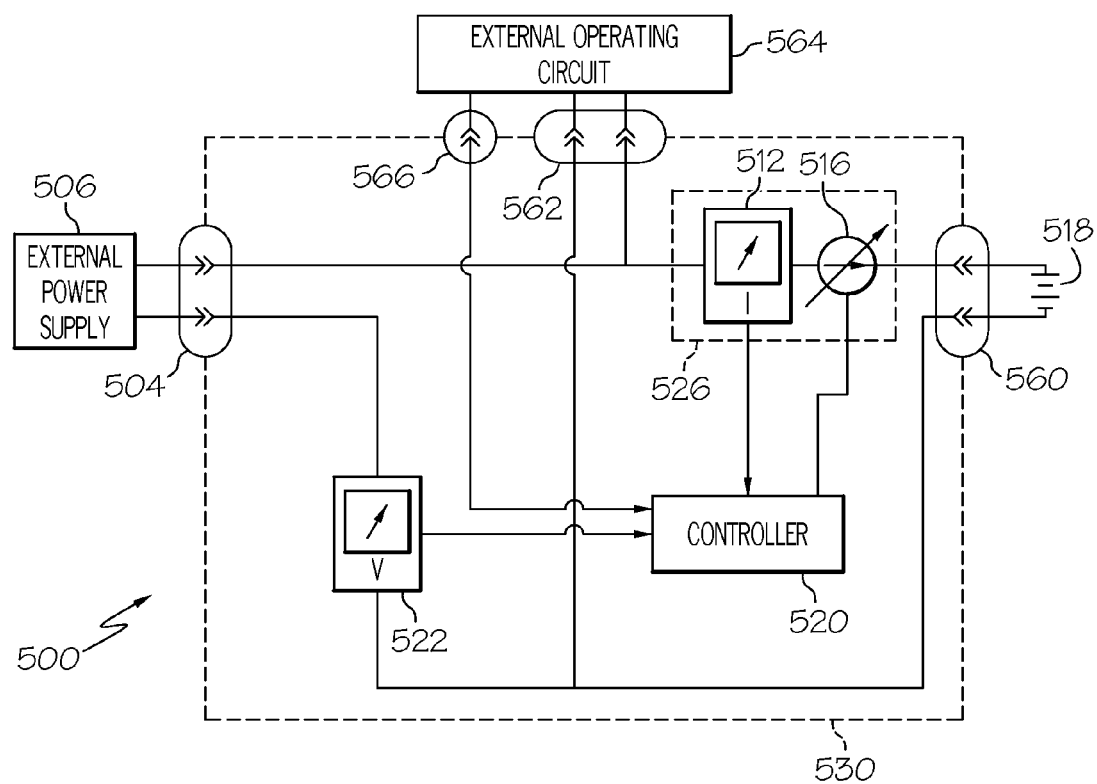
FIG. 5 is a circuit diagram of a power supply circuit.

FIG. 5 is a circuit diagram 500 of a power supply circuit 530. The circuit diagram 500 illustrates a portion of a stand-alone power supply circuit that is able to operate with or be incorporated into another electronic device. In the circuit diagram 500, an external power supply 506 is connected to the power supply circuit 530 through an external power connection 504. External power connection 504 is able to be included in a USB port or in a dedicated power connection port of the power supply circuit 530, such as the DC power connection 152 discussed above.

The power supply circuit 530 is detachably connected to an external operating circuit 564 through an external power supply output 562 and an operating circuit control interface 566. In one example, the external operating circuit 564 is able to be placed into one or more modes by communicating configuration commands from a controller 520 through the operating circuit control interface 566. The external operating circuit 564 is able to be configured into an operating mode that has a determined electrical current consumption, such as a standby mode.

The power supply circuit 530 is further connected to a battery 518 through power pack connector 560. Battery 518 is used as a power source when the external power supply 506 is not connected to the power supply circuit 530.

The power supply circuit 530 includes a controller 520 that controls the external operating circuit 564 via the operating circuit control interface 566 and also controls charging of the battery 518. The controller 520 is able to place the external operating circuit 564 into a mode that causes the external operating circuit 564 to draw a known electrical current value. The controller 520 further performs the power supply electrical current capacity determination process 400, described above.

The power supply circuit 530 includes a battery charging circuit 526 that has a battery electrical current meter 512 and a variable current limiter 516. The battery 518 in one example is electrically connected to the external power supply 506 through the battery charging circuit 526, and therefore in series with the battery electrical current meter 512 and the variable current limiter 516. The battery electrical current meter 512 measures the amount of electrical current flowing into or out of the battery 518. The battery electrical current meter 512 in one example provides a value of measured electrical current values to the controller 520. When the battery 518 is providing power to operate the power supply circuit 530, such as when the external power supply 506 is not connected, the battery electrical current meter 512 is monitored by controller 520 to determine the amount of electrical current drawn from the battery 518 to support estimating the amount of charge remaining in the battery 518.

The controller 520 commands the variable current limiter 516 to limit the charging current provided to battery 518 during battery charging. Once the electrical current supply capacity value of the external power supply 506 is determined, as is described in further detail above, the controller 520 is able to command the variable current limiter 516 to provide a maximum charging current to the battery 518 as a function of the determined electrical current capacity of the currently connected external power supply 506.

The power supply circuit 530 further includes a voltage meter 522 to measure the voltage being supplied by the external power supply 506. The controller 520 in one example is able to command the variable current limiter 516 to increase the amount of electrical current provided to charge the battery 518 until the voltage provided by the external power supply, which is monitored by controller 520 via the voltage meter 522, is reduced to a minimum level required by the external operating circuits 564.

Figure 6:
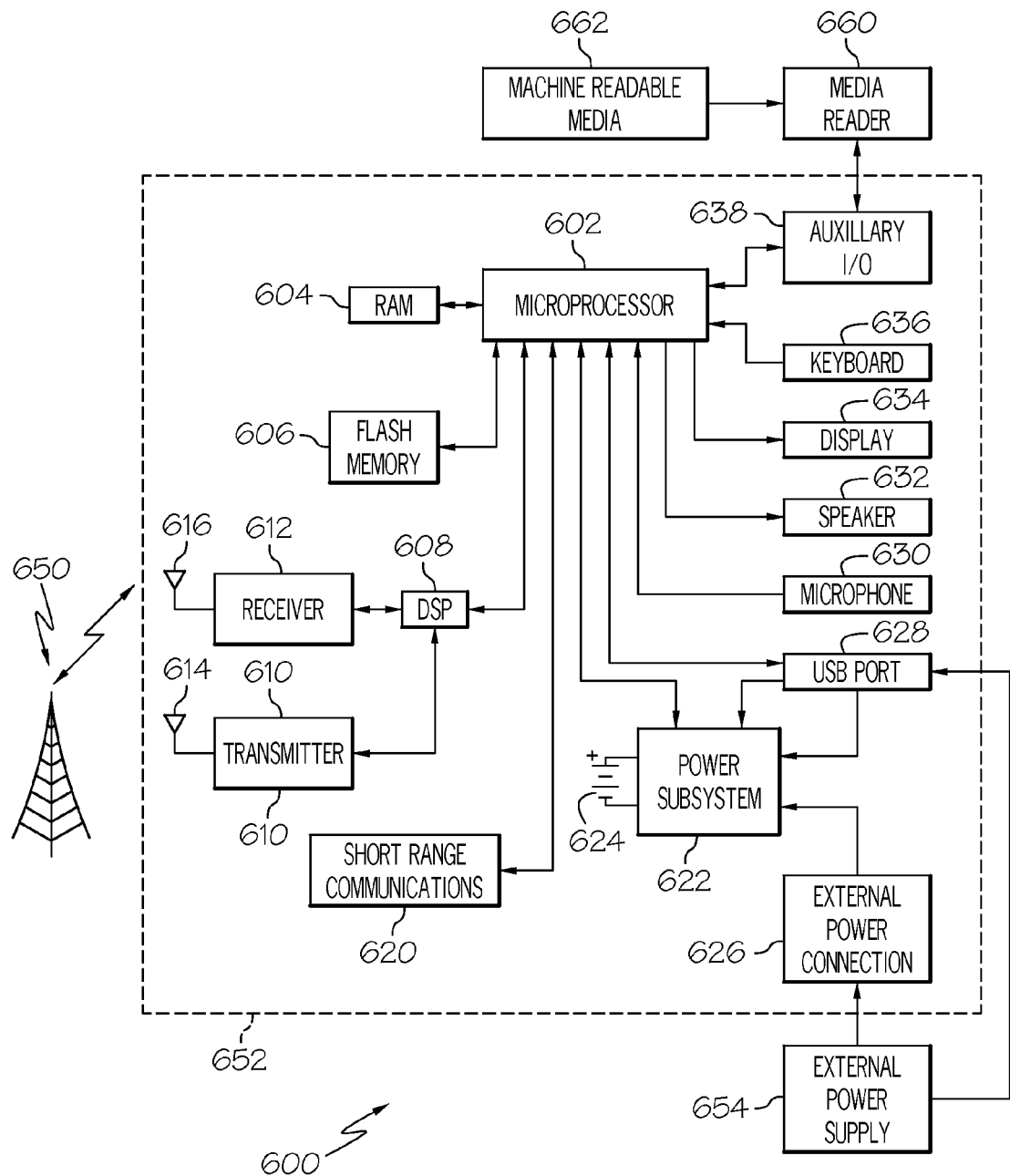
FIG. 6 is a block diagram of an electronic device and associated components in which the systems and methods disclosed herein may be implemented.

FIG. 6 is a block diagram of an electronic device and associated components 600 in which the systems and methods disclosed herein may be implemented. In this example, an electronic device 652 is a wireless two-way communication device with voice and data communication capabilities. Such electronic devices communicate with a wireless voice or data network 650 using a suitable wireless communications protocol. Wireless voice communications are performed using either an analog or digital wireless communication channel. Data communications allow the electronic device 652 to communicate with other computer systems via the Internet. Examples of electronic devices that are able to incorporate the above described systems and methods include, for example, a data messaging device, a two-way pager, a cellular telephone with data messaging capabilities, a wireless Internet appliance or a data communication device that may or may not include telephony capabilities.

The illustrated electronic device 652 is an example electronic device that includes two-way wireless communications functions. Such electronic devices incorporate communication subsystem elements such as a wireless transmitter 610, a wireless receiver 612, and associated components such as one or more antenna elements 614 and 616. A digital signal processor (DSP) 608 performs processing to extract data from received wireless signals and to generate signals to be transmitted. The particular design of the communication subsystem is dependent upon the communication network and associated wireless communications protocols with which the device is intended to operate.

The electronic device 652 includes a microprocessor 602 that controls the overall operation of the electronic device 652. The microprocessor 602 interacts with the above described communications subsystem elements and also interacts with other device subsystems such as flash memory 606, random access memory (RAM) 604, auxiliary input/output (I/O) device 638, USB Port 628, display 634, keyboard 636, speaker 632, microphone 630, a short-range communications subsystem 620, a power subsystem 622, and any other device subsystems.

A battery 624 is connected to a power subsystem 622 to provide power to the circuits of the electronic device 652. The power subsystem 622 includes power distribution circuitry for providing power to the electronic device 652 and also contains battery charging circuitry to manage recharging the battery 624. The power subsystem 622 is described above in further detail with regards to FIGS. 2, 3, and 5. The microprocessor 602 commands the power subsystem 622 to perform the power supply electrical current capacity determination process 400, described above, to determine an electrical current supply capacity value of an externally connected external power supply 654. The external power supply 654 is able to be connected to an external power connection 626 or through a USB port 628, as is described in detail above. The power subsystem 622 includes a battery monitoring circuit that is operable to provide a status of one or more battery status indicators, such as remaining capacity, temperature, voltage, electrical current consumption, and the like, to various components of the electronic device 652.

The USB port 628 further provides data communication between the electronic device 652 and one or more external devices, such as a computer 106 discussed above with regards to FIG. 1. Data communication through USB port 628 enables a user to set preferences through the external device or through a software application and extends the capabilities of the device by enabling information or software exchange through direct connections between the electronic device 652 and external data sources rather then via a wireless data communication network. In addition to data communication, the USB port 628 provides power to the power subsystem 622 to charge the battery 624 or to supply power to the electronic circuits, such as microprocessor 602, of the electronic device 652.

Operating system software used by the microprocessor 602 is stored in flash memory 606. Further examples are able to use a battery backed-up RAM or other non-volatile storage data elements to store operating systems, other executable programs, or both. The operating system software, device application software, or parts thereof, are able to be temporarily loaded into volatile data storage such as RAM 604. Data received via wireless communication signals or through wired communications are also able to be stored to RAM 604. As an example, a computer executable program configured to perform the power supply electrical current capacity determination process 400, described above, is included in a software module stored in flash memory 606.

The microprocessor 602, in addition to its operating system functions, is able to execute software applications on the electronic device 652. A predetermined set of applications that control basic device operations, including at least data and voice communication applications, is able to be installed on the electronic device 652 during manufacture. Examples of applications that are able to be loaded onto the device may be a personal information manager (PIM) application having the ability to organize and manage data items relating to the device user, such as, but not limited to, e-mail, calendar events, voice mails, appointments, and task items.

Further applications may also be loaded onto the electronic device 652 through, for example, the wireless network 650, an auxiliary I/O device 638, USB port 628, short-range communications subsystem 620, or any combination of these interfaces. Such applications are then able to be installed by a user in the RAM 604 or a non-volatile store for execution by the microprocessor 602.

In a data communication mode, a received signal such as a text message or web page download is processed by the communication subsystem, including wireless receiver 612 and wireless transmitter 610, and communicated data is provided the microprocessor 602, which is able to further process the received data for output to the display 634, or alternatively, to an auxiliary I/O device 638 or the USB port 628. A user of the electronic device 652 may also compose data items, such as e-mail messages, using the keyboard 636, which is able to include a complete alphanumeric keyboard or a telephone-type keypad, in conjunction with the display 634 and possibly an auxiliary I/O device 638. Such composed items are then able to be transmitted over a communication network through the communication subsystem.

For voice communications, overall operation of the electronic device 652 is substantially similar, except that received signals are generally provided to a speaker 632 and signals for transmission are generally produced by a microphone 630. Alternative voice or audio I/O subsystems, such as a voice message recording subsystem, may also be implemented on the electronic device 652. Although voice or audio signal output is generally accomplished primarily through the speaker 632, the display 634 may also be used to provide an indication of the identity of a calling party, the duration of a voice call, or other voice call related information, for example.

Depending on conditions or statuses of the electronic device 652, one or more particular functions associated with a subsystem circuit may be disabled, or an entire subsystem circuit may be disabled. For example, if the battery temperature is low, then voice functions may be disabled, but data communications, such as e-mail, may still be enabled over the communication subsystem.

A short-range communications subsystem 620 is a further optional component which may provide for communication between the electronic device 652 and different systems or devices, which need not necessarily be similar devices. For example, the short-range communications subsystem 620 may include an infrared device and associated circuits and components or a Radio Frequency based communication module such as one supporting Bluetooth® communications, to provide for communication with similarly-enabled systems and devices.

A media reader 660 is able to be connected to an auxiliary I/O device 638 to allow, for example, loading computer readable program code of a computer program product into the electronic device 652 for storage into flash memory 606. In one example, computer readable program code includes instructions for performing the power supply electrical current capacity determination process 400, described above. One example of a media reader 660 is an optical drive such as a CD/DVD drive, which may be used to store data to and read data from a computer readable medium or storage product such as computer readable storage media 662. Examples of suitable computer readable storage media include optical storage media such as a CD or DVD, magnetic media, or any other suitable data storage device. Media reader 660 is alternatively able to be connected to the electronic device through the USB port 628 or computer readable program code is alternatively able to be provided to the electronic device 652 through the wireless network 650.

Information Processing System

The present subject matter can be realized in hardware, software, or a combination of hardware and software. A system can be realized in a centralized fashion in one computer system, or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present subject matter can also be embedded in a computer program product, which comprises all the features enabling the implementation of the methods described herein, and which—when loaded in a computer system—is able to carry out these methods. Computer program in the present context means any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include computer readable storage medium embodying non-volatile memory, such as read-only memory (ROM), flash memory, disk drive memory, CD-ROM, and other permanent storage. Additionally, a computer medium may include volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information.

Non-Limiting Examples

Although specific embodiments of the subject matter have been disclosed, those having ordinary skill in the art will understand that changes can be made to the specific embodiments without departing from the spirit and scope of the disclosed subject matter. The scope of the disclosure is not to be restricted, therefore, to the specific embodiments, and it is intended that the appended claims cover any and all such applications, modifications, and embodiments within the scope of the present disclosure.

What is claimed is:

1. A method for determining a power supply electrical current capacity, the method comprising:
   performing the following with a processor:
   placing an operating circuit into an operating mode that causes the operating circuit to have a determined electrical current consumption;
   configuring a charging circuit to provide a maximum charging current to a power pack, wherein the charging circuit is electrically connected in parallel with the operating circuit;
   receiving from a current meter, subsequent to the configuring, a measured value of charging current flowing through the power pack, wherein the current meter is electrically connected in series with the power pack;
   calculating, subsequent to the receiving, a fixed maximum electrical current able to be produced by an external power supply,
      the fixed maximum electrical current able to be produced by the external power supply being a maximum output electrical current able to be produced by the external power supply in any configuration of the external power supply,
      the calculating the maximum electrical current able to be produced by the external power supply comprising calculating a sum of the determined electrical current consumption and the measured value of charging current flowing through the power pack;
   detecting the operating circuit is in a second operating mode;
   determining that the second operating mode has an electrical current consumption greater than the maximum electrical current able to be produced by the external power supply; and
   configuring, in response to determining the second operating mode has an electrical current consumption greater than the maximum electrical current able to be produced by the external power supply, a charging circuit of an electronic device to supply the operating circuits with power from both the power pack and the external power supply.

2. The method of claim 1, the placing the operating circuit into an operating mode comprises placing the operating circuit into a standby mode.

3. The method of claim 1, further comprising:
   providing the maximum electrical current able to be produced by the external power supply to a charging manager;
   determining a maximum charging current value as a function of the maximum electrical current able to be produced by the external power supply; and
   limiting, under control of the charging manager, charging current delivered to the power pack to the maximum charging current value.

4. The method of claim 3, further comprising determining a time remaining until the power pack is charged as a function of the maximum charging current value.

5. The method of claim 3, the determining the maximum charging current value being further a function of an electrical current consumption of the operating circuit.

6. The method of claim 1, further comprising measuring, with the current meter, the measured value of charging current flowing through the power pack.

7. The method of claim 1, further comprising configuring, by the processor, a device to determine a power supply electrical current capacity, wherein the configuring the device to determine the power supply electrical current capacity comprises:
   the processor placing, as part of configuring the device to determine a power supply electrical current capacity, the operating circuit into an operating mode being in response to a command by the processor, and
   the processor configuring, as part of configuring the device to determine a power supply electrical current capacity, the charging circuit to provide the maximum charging current to the power pack.

8. An apparatus for determining a power supply electrical current capacity, the apparatus comprising:
   an operating circuit;
   a charging circuit electrically connectable to a power pack and electrically connected in parallel with the operating circuit, the charging circuit switchably configurable to supply power to the operating circuit from the power pack;
   an electrical current measurement device electrically connected in series with the power pack and measuring electrical current flowing into the power pack;
   an external power connection detachably connecting to an external power supply, the external power connection being electrically connected to and supplying power to the operating circuit and the charging circuit; and
   a controller, communicatively coupled to the operating circuit and the charging circuit, the controller configured to:
      place the operating circuit into an operating mode, the operating circuit having a determined electrical current consumption while operating in the operating mode;
      configure the charging circuit to provide a maximum charging current to the power pack;
      receive, from the electrical current measurement device subsequent to the configuring, a measured value of charging current flowing through the power pack; and
      calculate, subsequent to the receiving, a fixed maximum electrical current able to be produced by an external power supply,
         the fixed maximum electrical current able to be produced by the external power supply being a maximum output electrical current able to be produced by the external power supply in any configuration of the external power supply, the maximum electrical current able to be produced by the external power supply being calculated as a sum of the determined electrical current consumption and the measured value of charging current flowing through the power pack;

detect that the operating circuit is in a second operating mode, determine that the operating circuit has an electrical current consumption in the second operating mode that is greater than the maximum electrical current able to be produced by the external power supply; and configure, in response to determining the second operating mode has an electrical current consumption in the second operating mode that is greater than the maximum electrical current able to be produced by the external power supply, the power supply to supply power to the operating circuits from both the power pack and the external power supply.

9. The apparatus of claim 8, the operating mode comprising a standby mode.

10. The apparatus of claim 8, the apparatus further comprising a voltage measurement device measuring a measured input voltage at the external power connection, the controller further configured to:
receive, from the voltage measurement device, readings of the measured input voltage; and
configure the charging circuit to provide a maximum charging current to the power pack by configuring the charging circuit to vary charging current to the power pack to cause the measured input voltage to be a specified minimum supply voltage.

11. The apparatus of claim 8, the controller further configured to:
determine a maximum charging current value for the power pack as a function of the maximum electrical current able to be produced by the external power supply; and
configure the charging circuit to limit charging current delivered to the power pack to the maximum charging current value.

12. The apparatus of claim 11, the controller further configured to determine, as a function of the maximum charging current value, a time remaining until the power pack is charged.

13. The apparatus of claim 11, the controller further configured to determine the maximum charging current value as a further function of an electrical current consumption of the operating circuit.

14. A computer program product for determining a power supply electrical current capacity, the computer program product comprising:
a non-transitory computer readable storage medium comprising computer readable program code, the computer readable program code comprising instructions for:
placing an operating circuit into an operating mode, the operating circuit having a determined electrical current consumption while operating in the operating mode; and
configuring a charging circuit to provide a maximum charging current to a power pack, the charging circuit being electrically connected in parallel with the operating circuit;
receiving from a current meter, subsequent to the configuring, a measured value of charging current flowing through the power pack, wherein the current meter is electrically connected in series with the power pack; and calculating, subsequent to the receiving, a fixed maximum electrical current able to be produced by an external power supply,
the fixed maximum electrical current able to be produced by the external power supply being a maximum output electrical current able to be produced by the external power supply in any configuration of the external power supply,
the calculating the maximum electrical current able to be produced by the external power supply comprising calculating a sum of the determined electrical current consumption and the measured value of charging current flowing through the power pack;

detecting that the operating circuit is in a second operating mode;

determining that the second operating mode has an electrical current consumption greater than the maximum electrical current able to be produced by the external power supply; and configuring, in response to determining the second operating mode has an electrical current consumption greater than the maximum electrical current able to be produced by the external power supply, a charging circuit of an electronic device to supply the operating circuits with power from both the power pack and the external power supply.

15. The computer program product of claim 14, the instructions for configuring a charging circuit to provide a maximum charging current to a power pack comprising instructions for:
monitoring a supply voltage provided by the external power supply; and
varying charging current to the power pack to cause the supply voltage to be a specified minimum supply voltage.

16. The computer program product of claim 14, the computer readable program code further comprising instructions for:
providing the maximum electrical current able to be produced by the external power supply to a charging manager;
determining a maximum charging current value as a function of the maximum electrical current able to be produced by the external power supply; and
limiting, under control of the charging manager, charging current delivered to the power pack to the maximum charging current value.

17. The computer program product of claim 16, the computer readable program code further comprising instructions for determining a time remaining until the power pack is charged as a function of the maximum charging current value.

18. The computer program product of claim 16, the determining the maximum charging current value being as a further function of an electrical current consumption of the operating circuit.

19. A power supply circuit that determines a power supply electrical current capacity, the power supply circuit comprising:
a power supply output to supply electrical current to an external operating circuit;
a charging circuit electrically connectable to a power pack and electrically connected in parallel with the power supply output, the charging circuit switchably configurable to supply power to the operating circuit from the power pack;
an electrical current measurement device electrically connected in series with the power pack and measuring electrical current flowing into the power pack;

an external power connection detachably connecting to an external power supply, the external power connection being electrically connected to and supplying power to the power supply output and the charging circuit;

an operating circuit control interface connecting to the operating circuit to exchange configuration commands with the operating circuit; and a controller, communicatively coupled to the operating circuit control interface and the charging circuit, the controller configured to:
  place the operating circuit into an operating mode, the operating circuit having a determined electrical current consumption while operating in the operating mode; and
  configure the charging circuit to provide a maximum charging current to the power pack;
  receive, from the electrical current measurement device subsequent to the configuring, a measured value of charging current flowing through the power pack; and
  calculate, subsequent to the receiving, a fixed maximum electrical current able to be produced by an external power supply,
    the fixed maximum electrical current able to be produced by the external power supply being a maximum output electrical current able to be produced by the external power supply in any configuration of the external power supply,
    the maximum electrical current able to be produced by the external power supply being calculated as a sum of the determined electrical current consumption and the measured value of charging current flowing through the power pack;
  detect that the operating circuit is in a second operating mode;
  determine that the operating circuit has an electrical current consumption in the second operating mode that is greater than the maximum electrical current able to be produced by the external power supply; and
  configure, in response to determining the second operating mode has an electrical current consumption in the second operating mode that is greater than the maximum electrical current able to be produced by the external power supply, the power supply to supply power to the operating circuits from both the power pack and the external power supply.

20. The power supply circuit of claim 19, further comprising the power pack, and the power pack being electrically connected to the charging circuit.

21. A portable electronic device that determines a power supply electrical current capacity, the portable electronic device comprising:
  an operating circuit;
  a power pack;
  a charging circuit electrically connected to the power pack and electrically connected in parallel with the operating circuit, the charging circuit switchably configurable to supply power to the operating circuit from the power pack;
  an electrical current measurement device electrically connected in series with the power pack and measuring electrical current flowing into the power pack;
  an external power connection detachably connecting to an external power supply, the external power connection being electrically connected to and supplying power to the operating circuit and the charging circuit; and
  a controller, communicatively coupled to the operating circuit and the charging circuit, the controller configured to:
    place the operating circuit into an operating mode, the operating circuit having a determined electrical current consumption while operating in the operating mode;
    configure the charging circuit to provide a maximum charging current to the power pack;
    receive, from the electrical current measurement device subsequent to the configuring, a measured value of charging current flowing through the power pack; and
    calculate, subsequent to the receiving, a fixed maximum electrical current able to be produced by an external power supply,
      the fixed maximum electrical current able to be produced by the external power supply being a maximum output electrical current able to be produced by the external power supply in any configuration of the external power supply,
      the maximum electrical current able to be produced by the external power supply being calculated as a sum of the determined electrical current consumption and the measured value of charging current flowing through the power pack;
    detect that the operating circuit is in a second operating mode;
    determine that the operating circuit has an electrical current consumption in the second operating mode that is greater than the maximum electrical current able to be produced by the external power supply; and
    configure, in response to determining the second operating mode has an electrical current consumption in the second operating mode that is greater than the maximum electrical current able to be produced by the external power supply, the power supply to supply power to the operating circuits from both the power pack and the external power supply.

22. The portable electronic device of claim 21, further comprising a housing containing the operating circuit, the charging circuit, the electrical current measurement device, and the controller, and
  the external power connection being physically attached to the housing.

* * * * *